(12) United States Patent
Wooten

(10) Patent No.: US 6,487,511 B1
(45) Date of Patent: Nov. 26, 2002

(54) METHOD AND APPARATUS FOR MEASURING CUMULATIVE DEFECTS

(75) Inventor: Christopher L. Wooten, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/234,992

(22) Filed: Jan. 21, 1999

(51) Int. Cl.[7] .............................................. G06F 17/00
(52) U.S. Cl. ............................. 702/84; 702/35; 702/81; 702/118; 700/110; 700/109; 700/121
(58) Field of Search ........................ 702/81–84, 33–36, 702/40, 117–119, 122, 170, 172, 179, 181, 51–59, 183–185, FOR 103, FOR 104, FOR 131, FOR 123, FOR 125, FOR 134, FOR 137, FOR 139, FOR 148, FOR 170, FOR 179; 438/14, 16–18; 700/109, 110, 121, 119, 120; 324/73.1, 718, 765, 537; 382/144, 145, 149, 141; 716/19

(56) References Cited

U.S. PATENT DOCUMENTS

| | | | | |
|---|---|---|---|---|
| 5,773,315 A | * | 6/1998 | Jarvis | 438/14 |
| 5,777,901 A | * | 7/1998 | Berezin et al. | 716/19 |
| 5,917,332 A | * | 6/1999 | Chen et al. | 438/14 |
| 5,991,699 A | * | 11/1999 | Kulkarni et al. | 702/83 |
| 6,098,024 A | * | 8/2000 | Chen et al. | 702/83 |
| 6,185,707 B1 | * | 2/2001 | Smith et al. | 382/145 |
| 6,246,787 B1 | * | 6/2001 | Hennessey et al. | 382/141 |

* cited by examiner

Primary Examiner—Hal Wachsman
(74) Attorney, Agent, or Firm—Williams, Morgan & Amerson, P.C.

(57) ABSTRACT

In one aspect of the present invention, a method and an apparatus are provided for determining a cumulative defect measure for a wafer lot. A wafer lot is selected for inspection. At least one wafer from the lot for inspection is selected. The wafer comprises a plurality of process layers and at least some of the process layers are selected for inspection for defects. The number, type, and kill ratio of the defects on each layer of the wafer selected are determined from inspection. A cumulative defect measurement for the wafer is determined based upon the number, type, and kill ratio of the defects on all inspected layers on the wafer. The cumulative defect measurement for the wafer is extrapolated to determine a quantified indication of a defectiveness of the selected wafer lot.

43 Claims, 6 Drawing Sheets

METHOD AND APPARATUS FOR MEASURING CUMULATIVE DEFECTS

BACKGROUND OF THE INVENTION

1. Field of the Invention

This invention relates generally to improving the yield and processing of semiconductor devices, and, more particularly, to measurement of cumulative defect analysis in semiconductor processes.

2. Description of the Related Art

The proliferation of the high technology industry has resulted in many innovations that improve our ability to create useful electronic devices. One commodity that is at a premium in the high technology industry is the semiconductor device. Semiconductor devices have become integral components in high technology products. The demands placed upon the high technology sector has created the need for new and creative solutions for issues regarding semiconductor designing, testing, and manufacturing. Many of these design, test, and manufacturing issues are not readily contemplated by many in the field. One such issue arises when defect data is collected during processing of semiconductor wafers.

The manufacture of integrated circuits (IC) is a complex and lengthy process involving hundreds of steps and rigorous manufacturing control. A variety of films, both conductive and insulative, are applied in successive steps to a semiconductor substrate (wafer). Each semiconductor wafer is subdivided into individual units, called die, and identical patterns are printed onto each die. The smallest features of these patterns extend into the sub-micron regime, hundreds of times smaller than a human hair.

During fabrication, several hundred potentially usable die are formed on the surface of a wafer. However, for a variety of reasons, such as manufacturing errors, not all of the die will result in a useful semiconductor product. Yield is a term used by the semiconductor industry to indicate the amount of usable die divided by the number of possible good die. Yield is typically expressed as a percentage since manufacturing processes are not perfect. Yield is of paramount importance to the IC manufacturer; companies stand to lose millions of dollars in profits if wafers do not yield according to projections. Defects introduced during the manufacturing process may cause die to fail, driving yield down. Thus, it is very important to monitor the yield of various manufacturing processes used to make semiconductor devices.

Defects can be generated by process tools, humans, or the environment in the manufacturing facility (the fab). Small particles, scratches, and residues from process tools are some of the types of defects that can corrupt a die. IC manufacturers utilize multi-million dollar tools to inspect wafer surfaces at critical points in the process in order to monitor the viability of the product. Some of these inspection tools generally use digital image comparison or laser scattering methodologies to "scan" the wafers and determine the presence of defects. The defect information (number, location on the wafer, size, etc.) for each wafer is then typically fed into a large database for further analysis. Technicians on the factory floor review the defects located by the scan tools using sophisticated microscopes and classify the defects (e.g., embedded particle, surface flake, pattern defect, etc.); these classifications are also fed into the database.

There are many types of defect analysis, yet no true industry-wide standard techniques exist. The current state-of-the-art relating to defect analysis leaves much room for improvement. Quite often, wafers reach the end of a process line and yield poorly. Vast amounts of resources are then fielded to investigate and determine the cause or causes of poor yield.

The present invention is directed to overcoming, or at least reducing the effects of, one or more of the problems set forth above.

SUMMARY OF THE INVENTION

In one aspect of the present invention, a method is provided for determining a cumulative defect measure for a wafer lot. A wafer lot is selected for inspection. At least one wafer from the lot for inspection is selected. The wafer comprises a plurality of process layers and at least some of the process layers are selected for inspection for defects. The number, type, and kill ratio of the defects on each layer of the wafer are determined. A cumulative defect measurement for the wafer is determined based upon the number, type, and kill ratio of the defects on all inspected layers on the wafer. The cumulative defect measurement for the wafer is extrapolated to determine a quantified indication of a defectiveness of the selected wafer lot.

The present invention further provides for an apparatus for determining a cumulative defect measure for a wafer lot, comprising a wafer processing line. A process control system interfaces with the wafer processing line and is capable of controlling the wafer processing line. A communication system, interfacing with the process control system, is capable of sending and receiving data. A system control is coupled to the communication system, and is capable of controlling the process control system. The apparatus of the present invention further comprises a means for calculating a cumulative defect measure for a wafer lot.

BRIEF DESCRIPTION OF THE DRAWINGS

The invention may be best understood by reference to the following description taken in conjunction with the accompanying drawings, in which like reference numerals identify like elements, and in which.

Figure 1:
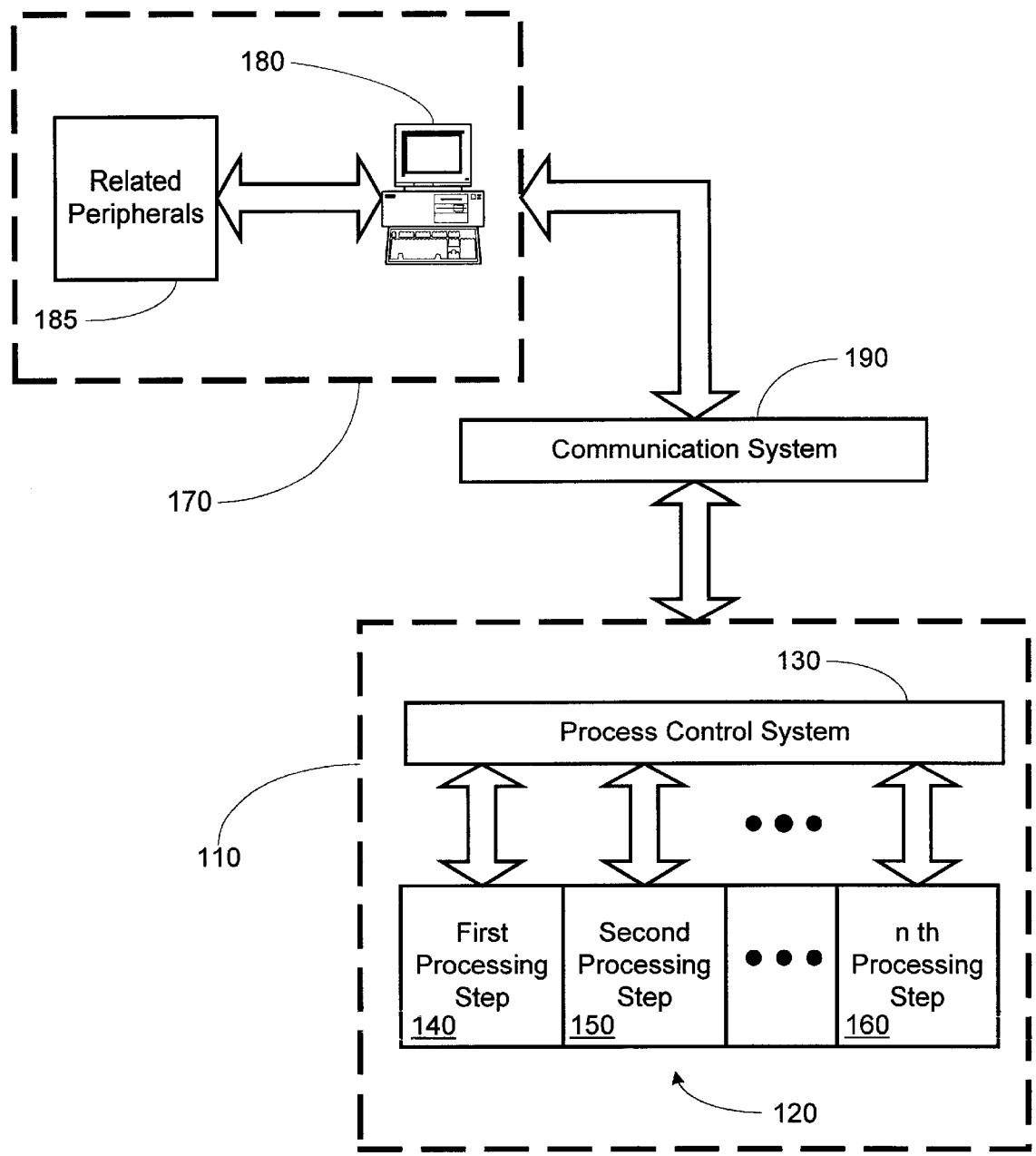
FIG. 1 illustrates one embodiment of an apparatus for the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Often, engineers and other high-technology professionals desire to conduct experiments and tests on semiconductor wafer lots, particularly during the manufacturing process. Generally, these high-technology professionals attempt to improve or change a wafer production process, e.g. a chemical vapor deposition process, an etching process, etc. The evaluation of the effectiveness of such process changes can become corrupted by defects that arise or are generated during the manufacturing process. Often, the process tools will generally spot defects on the semiconductor wafers. If the defects are not taken into account during the testing and experimental phases, then the results of the tests that have been performed on the semiconductor wafer sets may become corrupt. Applying the techniques disclosed by the present invention, a person skilled in the art is able to separate and deconvolute a yield signal into defect-related and process-related components.

The present invention provides a method to quantify the "defectivity" of a given set of wafers (known as a lot) using the classified scan data contained in the manufacturing facility's defect-database. The present invention utilizes classified defect data obtained at critical process levels and applies statistically generated kill ratios to determine the negative impact on yield resulting from such defects.

Turning now to FIG. 1, one embodiment of an apparatus for the present invention is shown. FIG. 1 illustrates a wafer processing section 110. The wafer processing section 110 includes a wafer processing line 120 and a process control system 130. The wafer processing line 120 includes multiple processing steps, i.e. a first processing step, 140 through "n" processing steps 160. The processing steps 140, 150, 160 are generally controlled and monitored by the process control system 130. Furthermore, the process control system 130 is controlled and monitored by the system control 170. The system control 170 includes a computer system 180 and related peripherals 185. The computer system 180 may include a Macintosh system, a UNIX system, a PC system, a VAX system, a Workstation system, or any other system employed by those skilled in the art.

The system control 170 controls the process control system 130 primarily through the communication system 190, which may include a network communication system, such as those commonly employed by those skilled in the art. The present invention may be run on traditional workstations, UNIX systems, PCs, etc. The apparatus described in the present invention, along with the method provided by the present invention, are used to obtain a quantified indication of the defectiveness of a wafer lot in a semiconductor manufacturing process.

Figure 2:
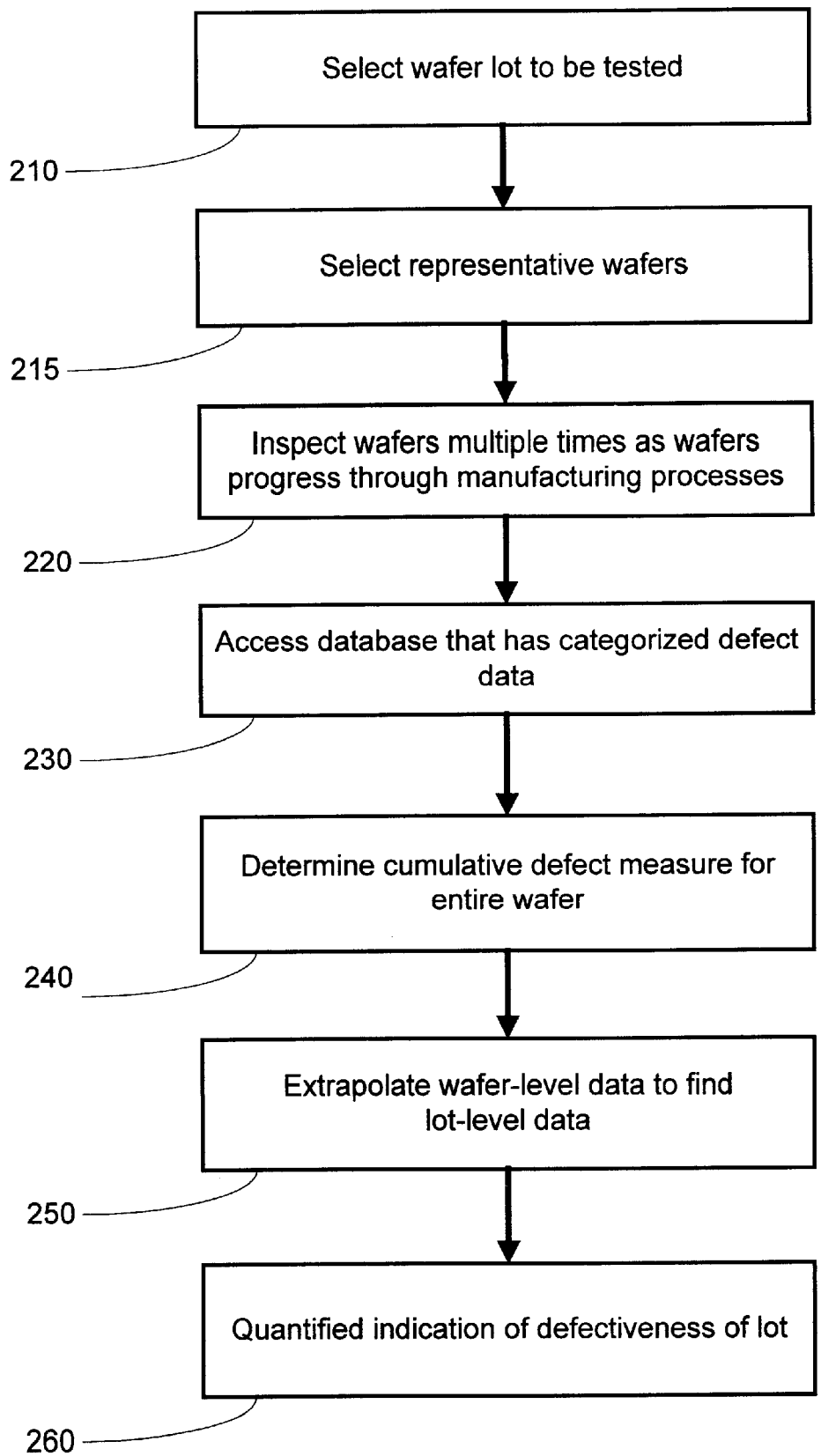
FIG. 2 illustrates one embodiment of the method taught by the present invention.

Turning now to FIG. 2, one illustrative embodiment of the present invention is shown. A wafer lot that is to be tested is selected, as shown in block 210. The wafer lot that is selected for testing is generally in the wafer processing line 120. Therefore, information on defects that may occur during different steps in the processing cycle can be compiled. Once a lot is selected for testing, representative wafers from the lot are chosen for testing, as described in block 215 of FIG. 2. In one embodiment, the representative wafers are selected using statistical analysis, or in an alternative embodiment, representative wafers may be selected randomly.

In order to tabulate defects that occur during various steps in the processing cycle, wafer samples that are to be tested are examined multiple times as the wafer progresses through various manufacturing processes, as shown in block 220. At selected points in the process flow, wafers are selected for inspection in accordance with the present method. The different processing steps generally correspond to multiple layers of semiconductive, conductive, and non-conductive material that are applied on the wafer being tested. Therefore, inspecting wafers at different periods of time, as described in block 220, corresponds to testing for defects at different layers in the wafer. Often, wafers are subjected to multiple process steps during semiconductor manufacturing. The process steps 1 through n generally correspond to layers 1 through n on a wafer.

There are a variety of types of defects that occur during wafer processing. The processing defects can be divided into two categories. The first category relates to defects that tend to occur only in specific layers on the wafer, called layer-specific defects. One illustrative example of these types of defects is the poly extra-pattern defect. The second category relates to defects that can occur in any layer on the wafer, called layer-independent defects. One illustrative example of these types of defects is the embedded particle defect. The methods that relate to examining layer-specific defects are employed only on layers that have been determined to possibly contain such defects. The methods that relate to examining layer-independent defects may be employed at all layers.

An integrated list of possible wafer defects is categorized and stored in a database. In one embodiment, the database is stored in a memory system of the computer system 180. The database contains defect data, which includes categorized defects and kill ratios that correspond to the categorized defects. The defects that are categorized into the layer-specific defect category and the layer-independent defect category are further categorized into more specific types of defects. The layer-specific defect categories may include among other things, poly extra-pattern defects and poly extra-pattern killer defects.

Figure 3:
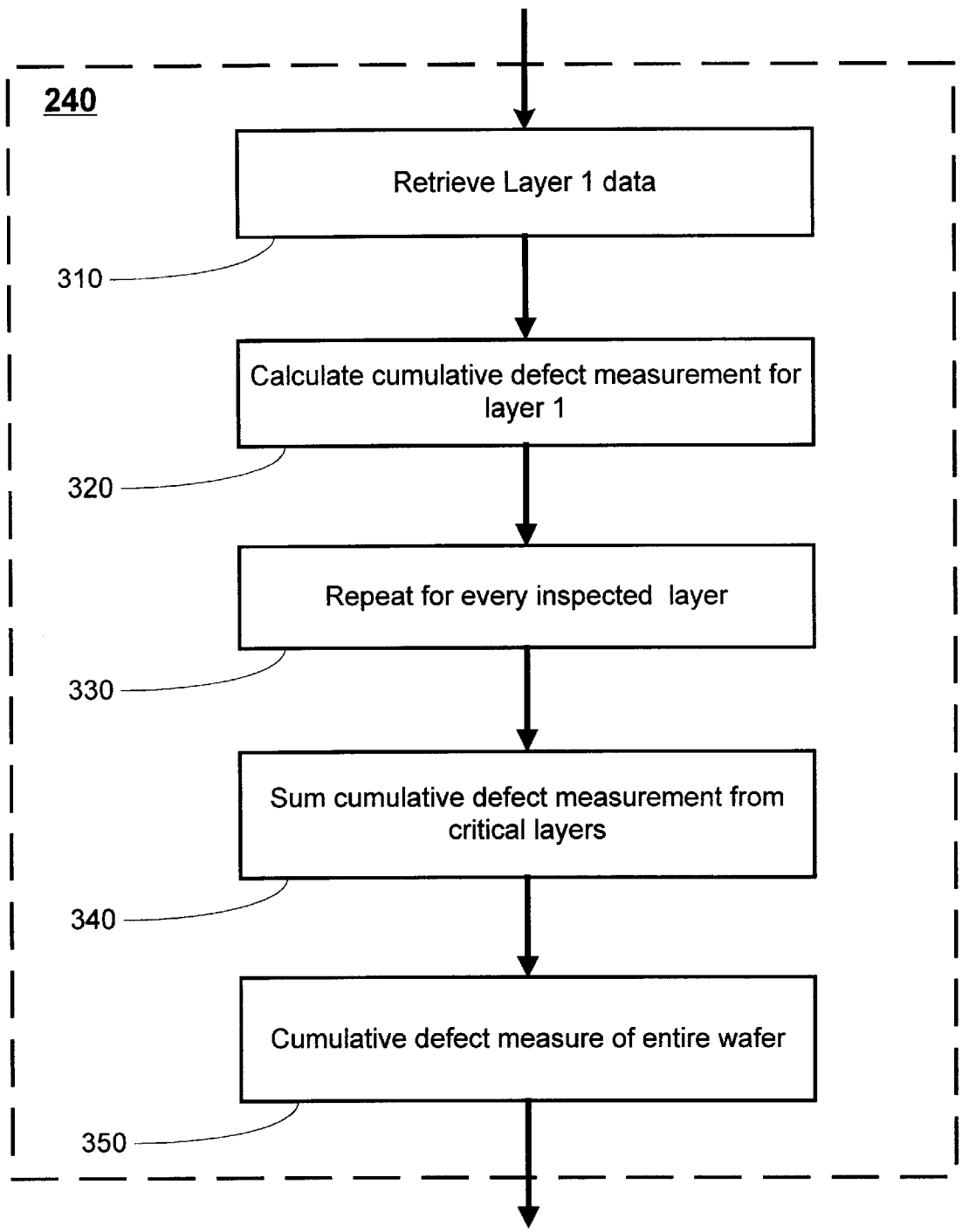
FIG. 3 illustrates a more detailed description of one of the steps (block 240) depicted in FIG. 2.

The defect data is accessed, as shown in block 230, in order to perform defect analysis on the wafer. The inspected wafer defect data and the categorized defect data from the database are used to determine the cumulative defect measure for the entire wafer, as described in block 240. FIG. 3 depicts a more detailed description of the step described in block 240 in FIG. 2. In order to determine the cumulative defect measure for the entire wafer, defect data for each inspected layer is analyzed and tabulated. The process described in FIG. 3 may be repeated on multiple wafers in a particular lot, and the average of the analyzed wafers may be used to represent the lot.

Turning now to FIG. 3, one illustration of the steps required to determine the cumulative defect measure for the entire wafer is shown. First, the defect data relating to layer-1 is retrieved from the database, as shown in block 310 of FIG. 3. This step includes retrieving data for de-clustered defects and defect class data. Often, one defect can appears as a large number of individual defects, such as a mechanical-scratch defect. Under some inspection techniques, one mechanical-scratch defect can appear as 500 individual defects, which will skew the defect analysis of the wafer. Therefore, defects such as mechanical scratches are clustered as one defect, which may only affect a handful of die on the wafer. Data relating to de-clustered defects, which are individually counted defects, are stored in the database and are retrieved for later analysis. The data retrieved from the database also includes the kill ratios that correspond to each type of defect.

The kill ratio of a defect refers to the likelihood that the particular defect in question would kill, or render useless, the die that contains the defect. For example, a metal short defect would have a high kill ratio. A large kill ratio for a defect indicates that a defect will very likely kill, or render useless, the die that contains the defect. The kill ratio can vary with the size of the defect. In some cases, a large defect can result in a large kill ratio. As an another example, the kill ratio corresponding to poly extra-pattern defects could be approximately 0.2, i.e. there is approximately a twenty percent chance that the poly extra-pattern defect will kill, or render useless, the die that contains the defect. As another example, if the kill ratio of a given defect type ranged from about 0.5 to about 0.7, then there is approximately a fifty to seventy percent chance that the poly extra-pattern killer defect will kill, or render useless, the die that contains the defect. The defect data obtained from inspection, as well as the assigned kill ratios for various types of defects, are used in combination to calculate the cumulative defect measurement for layer-1, as described in block 320 of FIG. 3. Using the present invention, a statistical analysis on multiple lots may be performed to determine kill ratio values. For example, the present invention may be used to analyze several hundred lots of wafers and determine that a poly extra pattern defect has a kill ratio value of approximately 0.5. Of course, this value may change as devices are continually scaled.

Figure 4:
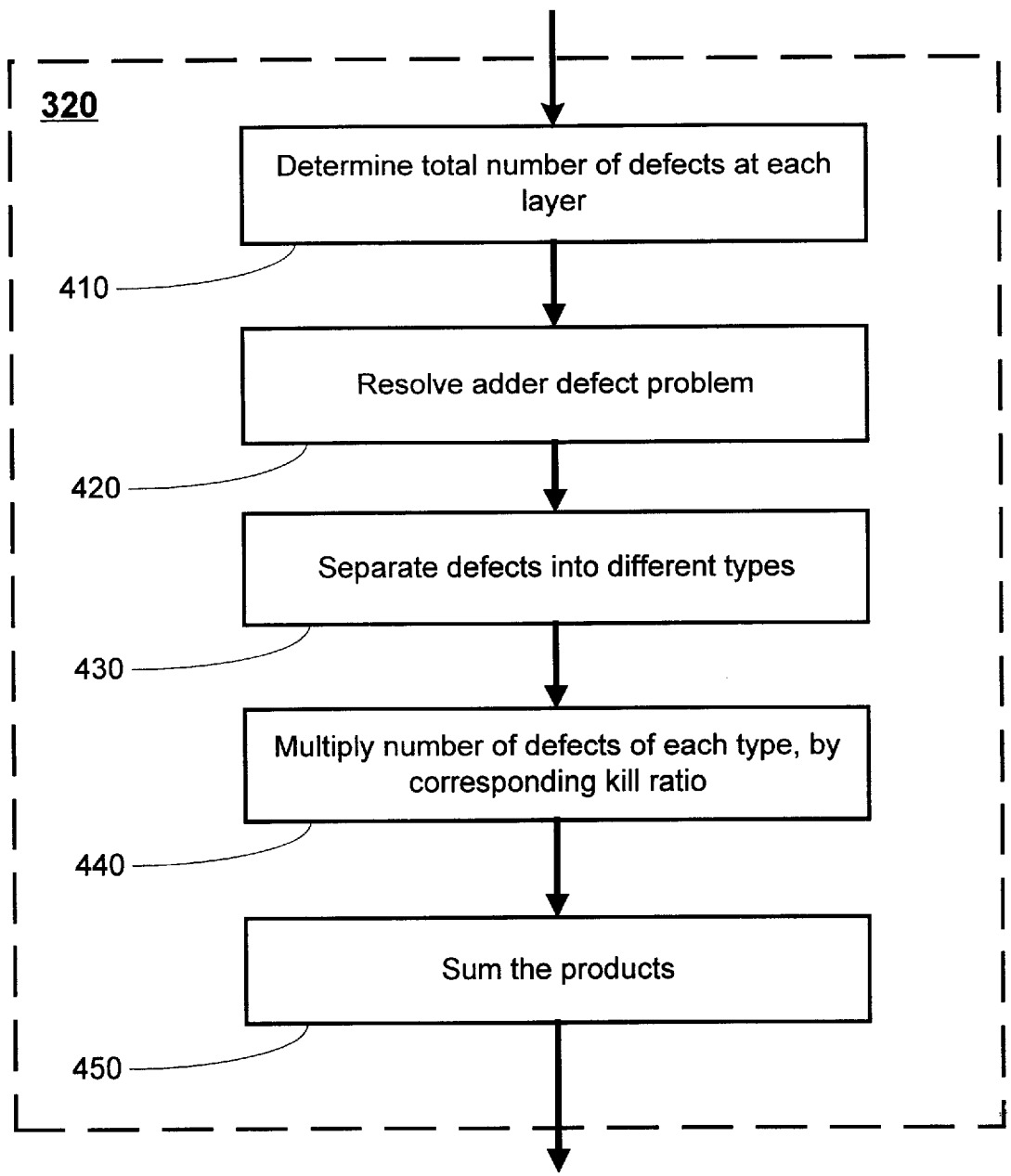
FIG. 4 illustrates a more detailed description of one of the steps (block 320) depicted in FIG. 3.

The methods for calculating the cumulative defect measurement for a layer, as described in block 320 of FIG. 3, are illustrated in further detail in FIG. 4. First, the total number of defects at each layer is determined, as shown in block 410 of FIG. 4. The defects on each layer may be observed by using optical or electrical processes, e.g. a scanning electron microscope. Once the number of defects on a layer is determined, the possibility of that these defects were counted more than once must be considered. For example, if a defect is detected at layer-1, and the employment of an optical inspection tool results in the detection of the same defect during the inspection of layer-4, then the same defect could be falsely accounted for more than once. The defects that have already been counted in a previous layer, but are detected again on another layer, are called previous layer defects. A defect that is added by the most recent process is called an adder defect.

Figure 5:
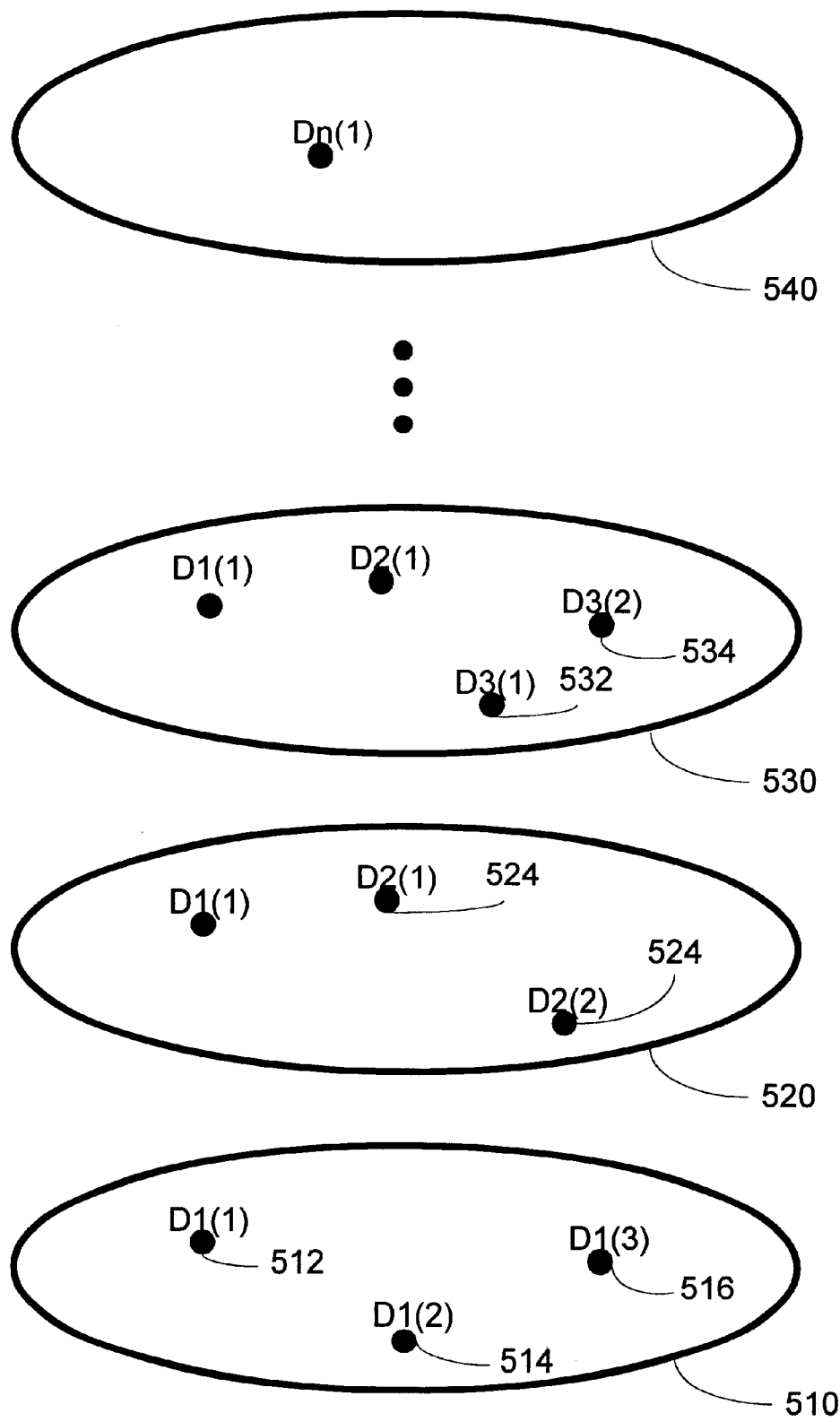
FIG. 5 illustrates the problem of previous layer defects, depicted on multiple layers that are applied to a wafer (not shown) during the processing of the wafer.

FIG. 5 illustrates the potential problem of previous layer defects and adder defects. FIG. 5 depicts multiple layers 510, 520, 530, 540 that are applied to a wafer (not shown) during the processing of the wafer. Process layer-1 510 contains three defects (D1(1), D1(2), and D1(3) 512, 514, 516 respectively). Process layer-2 520 contains two defects (D2(1) and D2(2) 522, 524 respectively). Process layer-3 530 contains two defects (D3(1) and D3(2) 532, 534 respectively). Process layer-n 540 contains one defect (Dn(1) 542). As illustrated in FIG. 5, inspection of process layer-2 520 may result in the detection of defects located on process layer-2 520, as well as detecting a defect located on process layer-1 510. Similarly, inspection of process layer-3 530 may result in detection of defects located on process layer-3 530, as well as defects located on process layer-2 520 and process layer-1 510. As illustrated in FIG. 5, when process layer-2 520 is inspected, some of the defects from process layer-1 510, D1(1) 512 and D1(2) 514, may be visible and inadvertently counted as a newly found defect, resulting in double counting. Furthermore, when process layer-3 530 is inspected, some of the defects from process layer-1 510 (D1(1) 512) and process layer-2 520 (D2(1) 522) may appear as if they were additional defects on process layer-3, thereby increasing the possibility of earlier defects being double counted.

Figure 6:
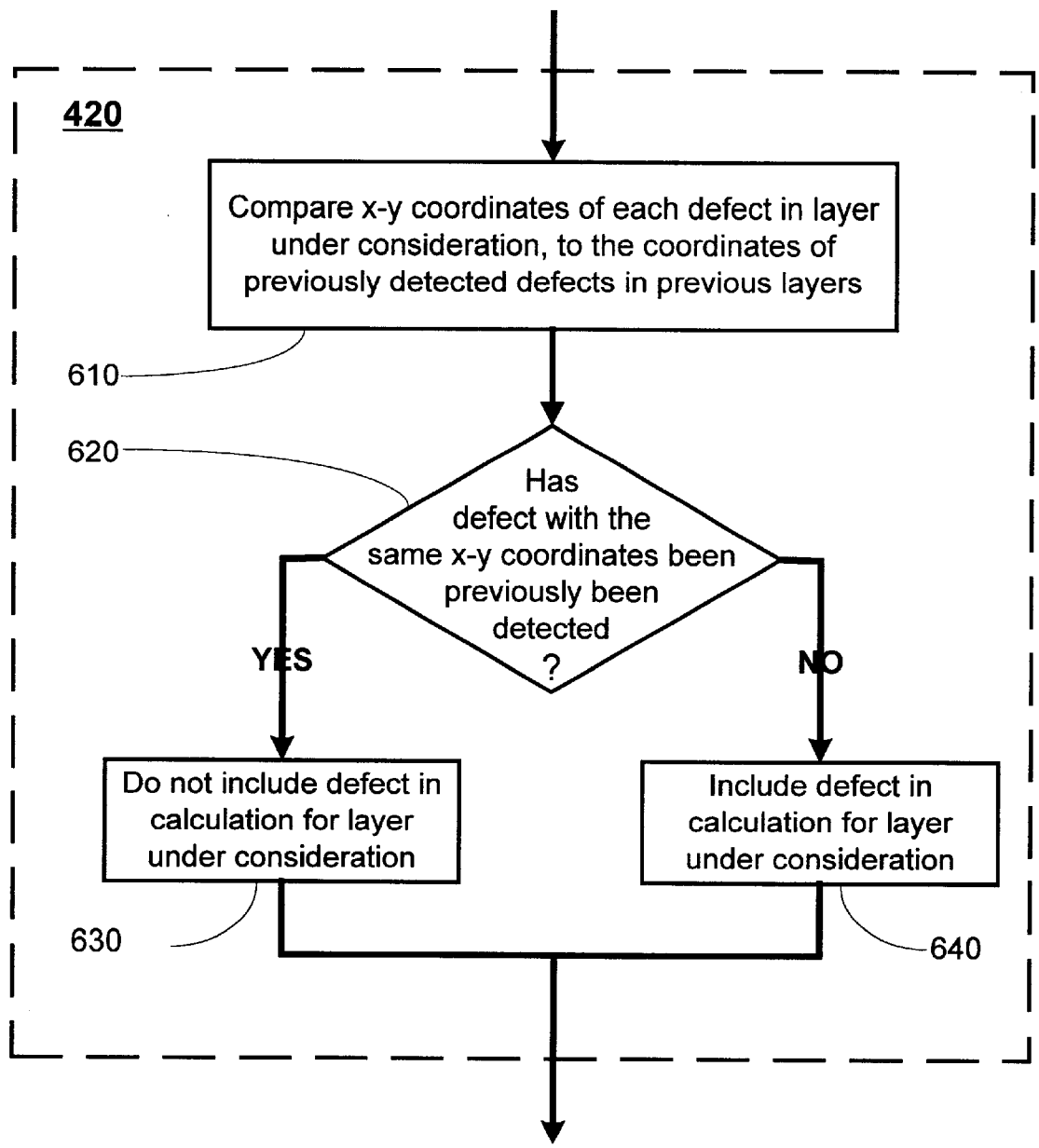
FIG. 6 illustrates a more detailed description of one of the steps (block 420) depicted in FIG. 4.

Previous layer defects, which are actual defects from another layer, will generally have the same x-y coordinates when detected on a new layer. Referring to FIG. 5, an actual defect on process layer-1 510, D1(1) 512, appears as a previous layer defect on process layer-2 520, at the same x-y coordinate on the wafer. The defect, D1(1), is a previous layer defect on process layer-2 520. The actual defect on process layer-1 510, D1(1), and an actual defect on process layer-2 520, D2(1), appear as actual defects on process layer-3 530, albeit they are previous layer defects on process layer-3 530. In order to avoid processing previous layer defects and thereby double counting defects, the previous layer defect problem should be resolved, as shown in block 420 of FIG. 4. The steps required to resolve the previous layer defect problem, as described in block 420, are described in further detail in FIG. 6.

When defects on a layer are detected, the actual defects must be separated from the previous layer defects. In order to locate the previous layer defects, the x-y coordinates of each defect found on the layer under inspection is compared to the coordinates of previously detected defects on other layers, as shown in block 610 of FIG. 6. The results of the comparison of the x-y coordinates of the current and previous defects are analyzed to determine whether a defect on the layer under inspection has the same coordinates as that of another defect on a layer that was previously examined, as described in block 620 of FIG. 6. In other words, the results of the comparison of the x-y coordinates of the current and previous defects are analyzed to see if a defect has previously been detected.

If a defect on any particular layer has been detected before, then that defect is a previous layer defect, and exists only on a layer that was previously analyzed. If a defect has previously been detected, then that defect is not included in the tabulation and calculation of defects in the wafer for the layer under consideration, as shown in block 630 of FIG. 6. If a defect has not previously been detected, then that defect will be included in the tabulation and calculation of defects in the wafer for the layer under consideration, as shown in block 640 of FIG. 6. At this point, the previous layer defects have been significantly eliminated, and the actual defects are accounted for.

Turning back to FIG. 4, after the previous layer defect problem has been resolved for a particular layer, as described in block 420, the total number of defects at a particular layer, minus the previous layer defects, remain. All of the defects on the layer under consideration are then separated into different categories, or types, of defects, as described in block 430 of FIG. 4. The step in block 430 is performed to determine the number of defects of each type. Once the numbers of defects of each type are determined, they are multiplied by the corresponding kill ratio for each type of defect, as described in block 440 in FIG. 4. The step described in block 440 results in a multiplicity of products that reflect the number of defects and their respective severities. The products of the number of defects and their respective kill ratios are then summed together, as described in block 450 of FIG. 4. At this point, a cumulative defect measurement for the present layer being examined is found.

In one embodiment, previous layer defects are excluded from the cumulative defect measurement analysis by excluding the previous layer defects through location analysis that is described above. In an alternative embodiment, the previous layer defects and the defects on the layer under inspection are used to tabulate a kill ratio that is used in the cumulative defect measurement calculation.

Turning back to FIG. 3, the cumulative defect measurement for a layer has been calculated, as described in block 320. The steps necessary to calculate the cumulative defect measurement of subsequent critical layers are repeated, as described in block 330 of FIG. 3. The number of critical layers examined is a matter of design choice that may vary depending upon a variety of factors, such as the type and desired quality of the devices under construction. Once the cumulative defect measurement for all inspected layers on a wafer is calculated, they are summed together, as described in block 340 of FIG. 3. The step of summing the cumulative defect measurement for all inspected layers produces a cumulative defect measure of the entire wafer, as described in block 350 of FIG. 3. The summed cumulative defect measure provides an indication of the severity of the existing defects on the entire wafer.

Turning back to FIG. 2, at this point, the cumulative defect measure has been determined for the representative wafer within a lot, as described in block 240. During semiconductor processing, a lot typically contains multiple wafers, e.g. 25 wafers. In one embodiment, four wafers from a lot of twenty-five wafers are selected as representative wafers. To obtain defect information on a lot-level basis, an extrapolation of the wafer-level data, obtained from the representative wafer or wafers selected from the lot under consideration, is performed. In one embodiment, the extrapolation performed is generally based upon statistical analysis, as described in block 250 of FIG. 2. These statistical extrapolations are readily known by those skilled in the art.

The extrapolation performed on the wafer-level data results in a quantified indication of the defectiveness of lot under construction, as indicated in block 260 of FIG. 2. Once determined, the quantified indication of the defectiveness of the lot can be used to evaluate the viability of the manufacturing process used, and to predict the reliability of the integrated circuit products derived from the wafers in that lot, etc. Furthermore, experiments and engineering studies performed on wafers can be better quantified by using the defectiveness data of the lot. For example, if the operation of many die in a wafer fails during an experiment, the defectiveness data of the wafer can be used to eliminate the possibility of failures being caused by defects. As will be apparent to those skilled in the art, the quantified indication of the defectiveness of a lot can be used for many important purposes related to semiconductor manufacturing.

The present invention can also be utilized to select "clean" lots for engineering process development. Development engineers continuously run complicated experiments in an effort to determine optimal process parameters and to improve such processes. However, random defects existing within a particular wafer or lot can independently degrade the yield of said wafers, thereby masking favorable implications of experimental process changes. The present invention may be used to rapidly assess the defectivity of a given lot and determine whether it is a possible candidate for experimentation.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for determining a cumulative defect measure for a wafer lot, comprising:

selecting a wafer lot to be inspected;

selecting at least one wafer from said wafer lot for inspection, said at least one wafer comprising a plurality of process layers, at least some of said process layers selected for inspection for defects;

determining the number, type, and kill ratio of said defects on each process layer of said at least one wafer selected for inspection;

determining a cumulative defect measurement for said at least one wafer based upon the number, type, and kill ratio of said defects on all inspected process layers on said at least one wafer; and extrapolating said cumulative defect measurement for said at least one wafer to determine a quantified indication of a defectiveness of said selected wafer lot.

2. The method as described in claim 1, wherein said step of determining the number, type, and kill ratio of said defects on each process layer of said at least one wafer selected for inspection further comprises:

determining the number of defects on each process layer inspected on said at least one wafer selected for inspection;

categorizing said defects on each layer according to type; and assigning a kill ratio for each type of defect on each process layer of said at least one wafer selected for inspection.

3. The method as described in claim 2, wherein said step of determining the number of defects on each process layer inspected on said at least one wafer selected for inspection further comprises performing an optical image inspection.

4. The method as described in claim 2, wherein said step of determining the number of defects on each process layer inspected on said at least one wafer selected for inspection further comprises performing a laser scattering inspection.

5. The method as described in claim 2, wherein said step of determining the number of defects on each process layer inspected on said at least one wafer selected for inspection further comprises performing a digital image comparison.

6. The method as described in claim 2, wherein said step of assigning a kill ratio for each type of defect on each process layer of said at least one wafer selected for inspection further comprises accessing a database to access said kill ratios for each type of defect on each process layer of said at least one wafer selected for inspection.

7. The method as described in claim 6, wherein said step of accessing a database further comprising accessing data for categorized defects and corresponding kill ratios for embedded particle defects.

8. The method as described in claim 7, wherein said kill ratios that corresponds to said embedded particle defects, is equal to about one.

9. The method as described in claim 6, wherein said step of accessing a database further comprises accessing data for categorized defects and corresponding kill ratios for poly extra-pattern defects.

10. The method as described in claim 9, wherein said kill ratio that corresponds to said poly extra-pattern defects, is equal to about 0.2.

11. The method as described in claim 6, wherein said step of accessing a database further comprises accessing data for categorized defects and corresponding kill ratios for poly extra-pattern killer defects.

12. The method as described in claim 11, wherein said kill ratios that corresponds to said poly extra-pattern killer defects, is equal to a range of about 0.5 to about 0.7.

13. The method as described in claim 1, wherein the step of selecting at least one wafer from said wafer lot for inspection further comprises performing statistical analysis to select said at least one wafer.

14. The method as described in claim 1, wherein the step extrapolating said cumulative defect measurement for said at least one wafer further comprises performing statistical analysis.

15. The method as described in claim 1, wherein said step of determining a cumulative defect measurement for an entire wafer further comprises:

calculating a cumulative defect measurement for each inspected process layer; and summing said cumulative defect measurement for all inspected process layers.

16. The method as described in claim 15, wherein said step of calculating a cumulative defect measurement of each inspected process layer further comprises;

determining a total number of said defects on said process layer under inspection;

reducing the total number of defects on said process layer under inspection by the number of defects determined to exist on any previously inspected process layer, to arrive at a number of actual defects existing on said process layer under inspection;

separating said actual defects into different types;

assigning a kill ratio to said different types of actual defects;

multiplying the number of said actual defects of each type by a kill ratio corresponding to each said actual defect to generate one or more multiplication products; and summing said one or more multiplication products.

17. The method as described in claim 16, wherein said step of separating said actual defects into different types further comprises categorizing said actual defects on said at least one wafer according to type.

18. The method as described in claim 17, wherein said step of categorizing said actual defects on said at least one wafer according to type further comprises separating certain actual defects into an embedded particle defects category.

19. The method as described in claim 17, wherein said step of categorizing said actual defects on said at least one wafer according to type further comprises separating certain actual defects into a poly extra-pattern defect category.

20. The method as described in claim 17, wherein said step of categorizing said actual defects on said at least one wafer according to type further comprises separating certain actual defects into a poly extra-pattern killer defect category.

21. The method as described in claim 16, wherein said step of reducing the total number of defects by the number of previous process layer defects determined to exist on any previously inspected process layer, to arrive at the number of actual defects existing on said process layer under inspection further comprises:

comparing x-y coordinates of each of said actual defects detected on said inspected process layer to x-y coordinates of at least one of previously detected defects on any previously inspected process layer;

determining whether said x-y coordinates of each of said actual defect on said inspected process layer corresponds to an x-y coordinate of at least one of said previously detected defects; and reducing the total number of defects on said inspected process layer by subtracting the total number of defects of said inspected process layer, by the number of defects on said inspected process layer that have been determined to have x-y coordinates corresponding to the x-y coordinates of any of said previously detected defects.

22. An apparatus for determining a cumulative defect measure for a wafer lot, comprising:

means for selecting a wafer lot to be inspected;

means for selecting at least one wafer from said wafer lot for inspection, said at least one wafer comprising a plurality of process layers, at least some of said process layers selected for inspection for defects;

means for determining the number, type, and kill ratio of said defects on each process layer of said at least one wafer selected for inspection;

means for determining a cumulative defect measurement for said at least one wafer based upon the number, type, and kill ratio of said defects on all inspected process layers on said at least one wafer; and means for extrapolating said cumulative defect measurement for said at least one wafer to determine a quantified indication of a defectiveness of said selected wafer lot.

23. A computer readable program storage device encoded with instructions that, when executed by a computer, said instructions perform a method for measuring cumulative defects, said instructions comprising:

instructions for selecting a wafer lot to be inspected;

instructions for selecting at least one wafer from said wafer lot for inspection, said at least one wafer comprising a plurality of process layers, at least some of said process layers selected for inspection for defects;

instructions for determining the number, type, and kill ratio of said defects on each process layer of said at least one wafer selected for inspection;

instructions for determining a cumulative defect measurement for said at least one wafer based upon the number, type, and kill ratio of said defects on all inspected process layers on said at least one wafer; and instructions for extrapolating said cumulative defect measurement for said at least one wafer to determine a quantified indication of a defectiveness of said selected wafer lot.

24. The computer readable program storage device encoded with instructions of claim 23, wherein said instructions for determining the number, type, and kill ratio of said defects on each process layer of said at least one wafer selected for inspection further comprises:

instructions for determining the number of defects on each process layer inspected on said at least one wafer selected for inspection;

instructions for categorizing said defects on each process layer according to type; and instructions for assigning a kill ratio for each type of defect on each process layer of said at least one wafer selected for inspection.

25. The computer readable program storage device encoded with instructions of claim 24, wherein said instructions for determining the number of defects on each process layer inspected on said at least one wafers selected for inspection further comprises instructions for performing an optical image inspection.

26. The computer readable program storage device encoded with instructions of claim 24, wherein said instructions for determining the number of defects on each process layer inspected on said at least one wafer selected for inspection further comprises instructions for performing a laser scattering inspection.

27. The computer readable program storage device encoded with instructions of claim 24, wherein said instructions for determining the number of defects on each process layer inspected on said at least one wafer selected for inspection further comprises instructions for performing a digital image comparison.

28. The computer readable program storage device encoded with instructions of claim 24, wherein said instructions for assigning a kill ratio for each type of defect on each process layer of said at least one wafer selected for inspection further comprises instructions for accessing a database to access said kill ratio for each type of defect on each process layer of said at least one wafer selected for inspection.

29. The computer readable program storage device encoded with instructions of claim 28, wherein said instructions for accessing a database further comprises instructions for accessing data for categorized defects and corresponding kill ratios for embedded particle defects.

30. The computer readable program storage device encoded with instructions of claim 29, wherein said kill ratios that corresponds to said poly extra-pattern defects, is equal to about 0.2.

31. The computer readable program storage device encoded with instructions of claim 28, wherein said instructions for accessing a database further comprises instructions for accessing data for categorized defects and corresponding kill ratios for poly extra-pattern defects.

32. The computer readable program storage device encoded with instructions of claim 31, wherein said kill ratios that corresponds to said poly extra-pattern defects, is equal to about 0.2.

33. The computer readable program storage device encoded with instructions of claim 28, wherein said instructions for accessing a database further comprises instructions for accessing data for categorized defects and corresponding kill ratios for poly extra-pattern killer defects.

34. The computer readable program storage device encoded with instructions of claim 33, wherein said kill ratio that corresponds to said poly extra-pattern killer defects, is equal a range of about 0.5 to about 0.7.

35. The computer readable program storage device encoded with instructions of claim 23, wherein the instructions for selecting at least one wafer from said wafer lot for inspection further comprises instructions for performing statistical analysis to select said at least one wafer.

36. The computer readable program storage device encoded with instructions of claim 23, wherein said instructions for extrapolating said cumulative defect measurement for said at least one wafer further comprises instructions for performing statistical analysis.

37. The computer readable program storage device encoded with instructions of claim 23, wherein said instructions for determining a cumulative defect measurement for an entire wafer further comprises:

instructions for calculating a cumulative defect measurement for each inspected process layer; and instructions for summing said cumulative defect measurement for all inspected process layers.

38. The computer readable program storage device encoded with instructions of claim 37, wherein said instructions for calculating a cumulative defect measurement of each inspected process layer further comprises;

instructions for determining a total number of said defects on said process layer under inspection;

instructions for reducing the total number of defects on said process layer under inspection by the number of defects determined to exist on any previously inspected process layer, to arrive at a number of actual defects existing on said process layer under inspection;

instructions for separating said actual defects into different types;

instructions for assigning a kill ratio to said different types of actual defects;

instructions for multiplying the number of said actual defects of each type by a kill ratio corresponding to each said actual defect to generate one or more multiplication products; and instructions for summing said one or more multiplication products.

39. The computer readable program storage device encoded with instructions of claim 38, wherein said instructions for separating said actual defects into different types further comprises instructions for categorizing said actual defects on said at least one wafer according to type.

40. The computer readable program storage device encoded with instructions of claim 39, wherein said instructions for categorizing said actual defects on said at least one wafer according to type further comprises instructions for separating certain defects into an embedded particle defects category.

41. The computer readable program storage device encoded with instructions of claim 39, wherein said instructions for categorizing said actual defects on said at least one wafer according to type further comprises instructions for separating certain defects into a poly extra-pattern defect category.

42. The computer readable program storage device encoded with instructions of claim 39, wherein said instructions for categorizing said actual defects on said at least one wafer according to type further comprises instructions for separating certain defects into a poly extra-pattern killer defect category.

43. The computer readable program storage device encoded with instructions of claim 38, wherein said instructions for reducing the total number of defects by the number of previous process layer defects determined to exist on any previously inspected process layer, to arrive at the number of actual defects existing on said process layer under inspection further comprises:

instructions for comparing x-y coordinates of each of said actual defects detected on said inspected process layer to x-y coordinates of at least one of previously detected defects on any previously inspected process layer;

instructions for determining whether said x-y coordinates of said defect on said inspected process layer corresponds to an x-y coordinate of at least one of said previously detected defects; and instructions for reducing the total number of defects on said inspected process layer by subtracting the total number of defects of said inspected process layer, by the number of defects on said inspected process layer that have been determined to have x-y coordinates corresponding to the x-y coordinates of any of said previously detected defect.

\* \* \* \* \*